(12) United States Patent
Terasawa et al.

(10) Patent No.: US 9,165,852 B2
(45) Date of Patent: Oct. 20, 2015

(54) MOUNTING STRUCTURE FOR PRINTED CIRCUIT BOARD, AND SEMICONDUCTOR DEVICE USING SUCH STRUCTURE

(71) Applicant: FUJI ELECTRIC CO., LTD., Kawasaki-shi (JP)

(72) Inventors: Noriho Terasawa, Matsumoto (JP); Yasuyuki Momose, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/349,023

(22) PCT Filed: Sep. 18, 2012

(86) PCT No.: PCT/JP2012/073793
§ 371 (c)(1),
(2) Date: Apr. 1, 2014

(87) PCT Pub. No.: WO2013/051387
PCT Pub. Date: Apr. 11, 2013

(65) Prior Publication Data
US 2014/0233188 A1 Aug. 21, 2014

(30) Foreign Application Priority Data
Oct. 7, 2011 (JP) ................. 2011-222405

(51) Int. Cl.
*H01L 23/12* (2006.01)
*H01L 23/34* (2006.01)
(Continued)

(52) U.S. Cl.
CPC .............. *H01L 23/34* (2013.01); *H01L 23/049* (2013.01); *H05K 1/0271* (2013.01); *H05K 3/368* (2013.01); *H05K 7/02* (2013.01); *H05K 7/142* (2013.01); *H05K 7/1432* (2013.01); *H01L 23/36* (2013.01); *H01L 23/3735* (2013.01); *H01L 24/32* (2013.01); *H01L 24/48* (2013.01); *H01L 24/73* (2013.01); *H01L 25/072* (2013.01); *H01L 2224/32225* (2013.01); *H01L 2224/48091* (2013.01);
(Continued)

(58) Field of Classification Search
CPC .................................. H01L 23/34; H05K 7/02
USPC ............................................................ 257/704
See application file for complete search history.

(56) References Cited

U.S. PATENT DOCUMENTS 6,958,535 B2 * 10/2005 Hirano et al. ................. 257/707
6,972,479 B2 * 12/2005 Chen et al. ..................... 257/666
(Continued)

FOREIGN PATENT DOCUMENTS

| JP | S61-205199 U | 12/1986 |
|---|---|---|
| JP | H05-008985 U | 2/1993 |

(Continued)

OTHER PUBLICATIONS

PCT, "International Search Report for International Application No. PCT/JP2012/073793".

*Primary Examiner* — Luan C Thai
(74) *Attorney, Agent, or Firm* — Manabu Kanesaka (57) ABSTRACT

A mounting structure for a printed circuit board, includes a printed circuit board to which a heavy material is fixed; a fixing member fixed to the printed circuit board immediately below the heavy material; and a receiving member fixed to a main body. A bottom portion of the fixing member is disposed in the receiving member, and fixed to the receiving member by a resin adhesive.

14 Claims, 5 Drawing Sheets

(51) Int. Cl.
*H05K 1/02* (2006.01)
*H05K 3/36* (2006.01)
*H05K 7/14* (2006.01)
*H05K 7/02* (2006.01)
*H01L 23/049* (2006.01)
*H01L 23/00* (2006.01)
*H01L 25/07* (2006.01)
*H01L 23/36* (2006.01)
*H01L 23/373* (2006.01)

(52) U.S. Cl.
CPC ............... *H01L2224/48227* (2013.01); *H01L 2224/73265* (2013.01); *H01L 2924/19041* (2013.01); *H01L 2924/19042* (2013.01); *H01L 2924/19105* (2013.01); *H05K 2201/2036* (2013.01); *H05K 2201/2045* (2013.01); *H05K 2201/2072* (2013.01)

(56) References Cited

U.S. PATENT DOCUMENTS

| | | | |
|---|---|---|---|
| 8,115,293 B2* | 2/2012 | Moon et al. | 257/686 |
| 8,169,784 B2* | 5/2012 | Sakamoto et al. | 361/729 |
| 8,207,607 B2* | 6/2012 | Yamagishi et al. | 257/724 |
| 8,842,438 B2* | 9/2014 | Kim et al. | 361/728 |
| 2003/0042624 A1 | 3/2003 | Shinohara | |
| 2008/0158824 A1 | 7/2008 | Aoki et al. | |

FOREIGN PATENT DOCUMENTS

| | | |
|---|---|---|
| JP | H10-065362 A | 3/1998 |
| JP | H11-220274 A | 8/1999 |
| JP | 2000-068446 A | 3/2000 |

\* cited by examiner

MOUNTING STRUCTURE FOR PRINTED CIRCUIT BOARD, AND SEMICONDUCTOR DEVICE USING SUCH STRUCTURE

RELATED APPLICATIONS

The present application is National Phase of International Application No. PCT/JP2012/073793 filed Sep. 18, 2012, and claims priority from Japanese Application No. 2011-222405 filed Oct. 7, 2011.

TECHNICAL FIELD

The present invention relates to a mounting structure for a printed circuit board, which is used for mounting a printed circuit board having a heavy material such as a transformer thereon, onto a main body. The present invention also relates to a semiconductor device that uses this structure.

BACKGROUND ART

Semiconductor devices such as power semiconductor modules and various other parts are used in power conversion systems, such as inverters and converters, and in on-board electrical circuits. These semiconductor devices and various parts are often exposed to vibration environments during their operations.

Next is described a mounting structure for a printed circuit board, in which a printed circuit board having a heavy material such as a transformer, a capacitor or other electrical circuit part thereon is mounted on a chassis (a housing) fixed with a power semiconductor module or the engine of an automobile. An object (the power semiconductor module or the automobile chassis) onto which the printed circuit board is mounted is referred to as "main body" herein.

Figure 7:
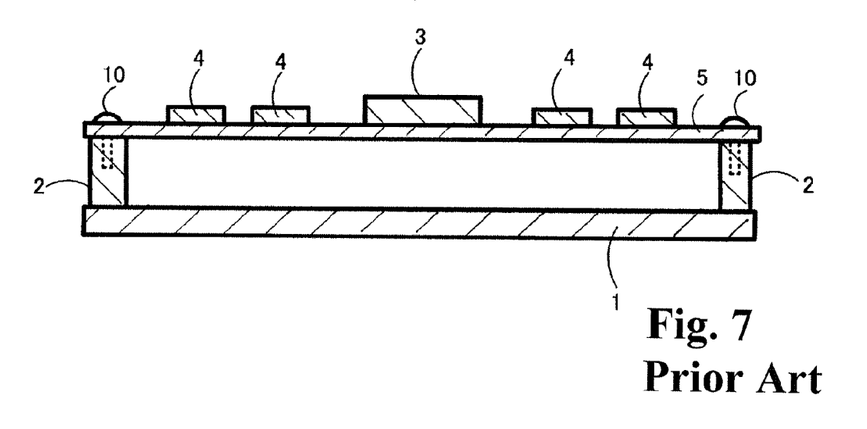
FIG. 7 is a cross-sectional view showing substantial parts of a conventional printed circuit board mounting structure.

FIG. 7 is a cross-sectional diagram showing substantial parts of a conventional printed circuit board mounting structure. Fixation members 2 are fixed to corners of a main body 1, and a printed circuit board 5 is disposed above the main body 1 in such a manner that corners of the printed circuit board 5 are positioned on the fixation members 2. The printed circuit board 5 is fixed to the fixation members 2 by screwing the corners of the printed circuit board 5 with screws 10.

However, when the printed circuit board 5 is larger than the main body 1, the screws 10 are placed not only on the corners of the printed circuit board 5 but also on the other parts of the printed circuit board 5 at predetermined intervals.

A heavy material 3, such as a transformer, a capacitor, or an inductor, is fixed in the central part of the printed circuit board 5. Light materials 4, such as resistors or semiconductor elements, are fixed around the heavy material 3. In other words, the heavy material 3 and the light materials 4 here are electrical parts.

This conventional mounting structure for the printed circuit board 5 in which the corners of the printed circuit board 5 are fixed by the screws 10 and the fixation members 2 is a beam model structure for supporting both ends of the printed circuit board 5. Therefore, when the main body 1 vibrates, the printed circuit board 5 consequently vibrates. The printed circuit board 5 vibrates with large amplitude with low resonance frequency because the printed circuit board 5 has the heavy material 3 fixed at its central part.

An electronic circuit device described in Patent Document 1 has a lower substrate on which a principal circuit is formed, an upper substrate on which a drive control circuit for controlling drive of the principal circuit is formed, and a resin case. This resin case has external lead terminals of the principal circuit and the drive control circuit at an external surface of a circumferential edge and has a substrate storage space on the inside of the circumferential edge. In this electronic circuit device, the upper substrate is located above the lower substrate, and the space above the lower substrate is filled with filler. In this electronic circuit device, resin is used as the filler, and a supporting material is fixed to a position above the lower substrate with the hardened resin. Fixing and supporting the upper substrate using this supporting material can enhance vibration resistance and reliability of the upper substrate. For example, four of the supporting materials (such as bolts) are disposed around a heavy material to fix the heavy material onto the upper substrate.

Patent Document 2 describes a power semiconductor device in which a power element is sealed into a package. This semiconductor device contains the package, the power element fixed into the package, bonding wires connected to the power element, and a gelled insulator covering the power element. The inside of the package is filled with a foaming material so as to fill a hollow section remaining in the package. This can prevent damage due to resonance of the components of the power semiconductor device which is caused when the power semiconductor device is used under conditions in which vibrations are applied thereto from the outside.

Patent Document 1: Japanese Patent Application Publication No. 2008-166358

Patent Document 2: Japanese Patent Application Publication No. 2003-68940

DISCLOSURE OF THE INVENTION

In the conventional mounting structure for the printed circuit board 5 described with reference to FIG. 7, the resonance frequency of the printed circuit board 5 is low and therefore enters the vibration frequency band of the main body 1.

For this reason, the printed circuit board 5 resonates with the main body 1, increasing the amplitude of the heavy material 3, which makes the heavy material 3 vibrate heavily. This vibration consequently destroys the printed circuit board 5 having the heavy material 3 thereon. The printed circuit board vibrates in X, Y, and Z directions. Examples of the destruction of the printed circuit board 5 having the heavy material 3 thereon, which is caused by vibrations, include destruction at the connection between the printed circuit board 5 and the terminal of the heavy material 3 such as a transformer or a capacitor, and rupture of the terminal.

The method described in Patent Document 1 prevents such destruction by bolting the periphery of the heavy material. However, although the resonance frequency increases due to the presence of a little distance between the heavy material and the bolts, the heavy material still vibrates, and therefore vibration-related destruction cannot completely be prevented. Moreover, bolting the periphery of the heavy material increases the dead space.

Even when attempting to exclude the resonance frequency by surrounding the heavy material with the foaming material such as polyurethane as described in Patent Document 2, such foaming material cannot be used on the main body that is used in a high-temperature environment.

Although a method of using silicon resin or epoxy resin resistant to a high-temperature environment can be taken into consideration, the soft silicon resin is not useful for reducing vibrations. The hard epoxy resin, on the other hand, can exert the effect of reducing vibrations, but enters the gap between a part loaded on the printed circuit board and the printed circuit board and peels the part off the circuit board due to the difference in thermal expansion coefficient or destroys the part itself.

An object of the present invention is to solve the problems described above and provide a mounting structure for a printed circuit board, and a semiconductor device using this mounting structure, the mounting structure being capable of increasing the resonance frequency of a printed circuit board with a heavy material thereon and excluding the resonance frequency from the vibration frequency band of a main body, to prevent the printed circuit board from being destroyed by its resonance.

In order to achieve the object described above, a mounting structure for a printed circuit board according to the present invention has the following characteristics. In other words, the mounting structure has a printed circuit board fixed with a heavy material; a fixing member fixed to the printed circuit board directly below the heavy material; and a receiving member fixed to a main body, wherein a bottom portion of the fixing member is disposed in the receiving member and fixed to the receiving member by resin adhesive.

In the mounting structure for a printed circuit board according to the present invention, according to the invention described above, the fixing member is a metal anchor, the receiving member is a resin tray, and the resin adhesive is an epoxy resin.

In the mounting structure for a printed circuit board according to the present invention, according to the invention described above, a side surface of the bottom portion of the fixing member has a projection.

In the mounting structure for a printed circuit board according to the present invention, according to the invention described above, the receiving member is a part of the main body.

In order to solve the problems described above and achieve the object of the present invention, a semiconductor device according to the present invention has the following characteristics. In other words, the semiconductor device has a heat dissipation base; a conductive-patterned insulating substrate fixed onto the heat dissipation base; a semiconductor chip fixed to the conductive-patterned insulating substrate; an electric conductor connecting the semiconductor chip and an external lead terminal; a resin case fixed to the heat dissipation base, and storing the conductive-patterned insulating substrate fixed with the semiconductor chip; a lid fixed to the resin case; a receiving member fixed onto the lid; a fixing member having a bottom portion fixed to the receiving member by a resin adhesive; a printed circuit board to which an upper portion of the fixing member is fixed; and a screw member for fixing each of corners of the printed circuit board to the resin case, wherein the printed circuit board, the fixing member, the receiving member, and the resin adhesive configure a mounting structure for the printed circuit board.

In order to solve the problems described above and the object of the present invention, the semiconductor device according to the present invention has the following characteristics. In other words, the semiconductor device has a heat dissipation base; a conductive-patterned insulating substrate fixed onto the heat dissipation base; a semiconductor chip fixed to the conductive-patterned insulating substrate; an electric conductor connecting the semiconductor chip and an external lead terminal; a receiving member fixed onto the conductive-patterned insulating substrate; a fixing member having a bottom portion fixed to the receiving member by a resin adhesive; a printed circuit board to which an upper portion of the fixing member is fixed; a screw member for fixing each of corners of the printed circuit board to the conductive-patterned insulating substrate; a resin case fixed to the heat dissipation base, and storing the conductive-patterned insulating substrate fixed with the semiconductor chip, the receiving member, the fixing member, and the printed circuit board; and a lid fixed to the resin case, wherein the printed circuit board, the fixing member, the receiving member, and the resin adhesive configure a mounting structure for the printed circuit board.

In the semiconductor device according to the present invention, according to the invention described above, the fixing member may be a metal anchor, the receiving member may be a resin tray, and the resin adhesive may be an epoxy resin.

Furthermore, in the semiconductor device according to the present invention, according to the invention described above, a projection in a horizontal direction is disposed in a bottom portion of the anchor.

In the semiconductor device according to the present invention, according to the invention described above, the receiving member may be a part of the lid.

According to the present invention, the printed circuit board having the heavy material thereon is fixed to the main body immediately below the heavy material by using a mounting member, thereby increasing the resonance frequency of the printed circuit board, excluding the resonance frequency from the vibration frequency band of the main body, and reducing the amplitude of the heavy material. As a result, the printed circuit board with the heavy material thereon can be prevented from being destroyed by its resonance.

In addition, the semiconductor device produced using this mounting structure for the printed circuit board can prevent the printed circuit board having the heavy material thereon from being destroyed by its resonance.

BRIEF DESCRIPTION OF THE DRAWINGS

FIGS. 1(a), 1(b) are configuration diagrams of a mounting structure for a printed circuit board according to a first embodiment of the present invention, wherein

FIGS. 3(a)-3(h) are diagrams showing a mounting member 9 of FIG. 1(a), wherein

BEST MODE FOR CARRYING OUT THE INVENTION

Embodiments of the present invention are described hereinafter with the following examples. The same reference numerals are denoted to the parts same as the conventional parts.

<First Embodiment>

Figure 1A:
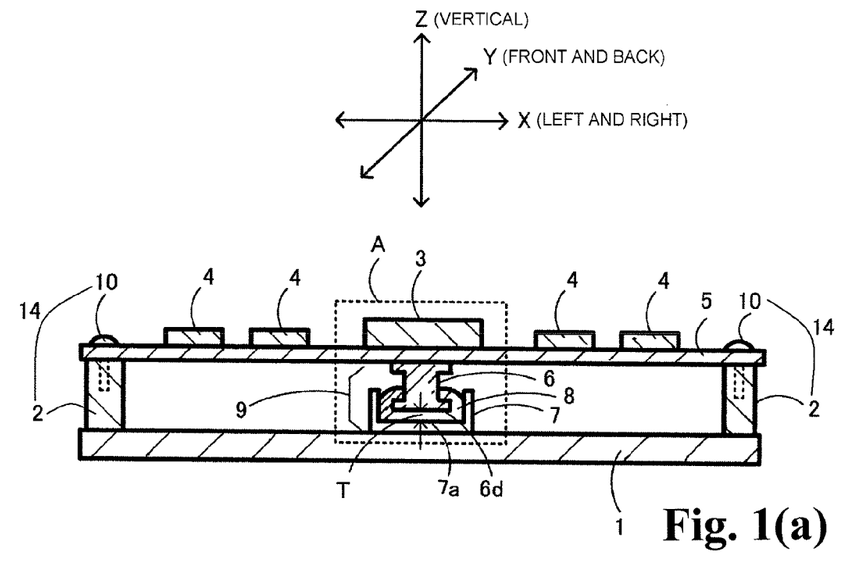
FIG. 1(a) is a cross-sectional view of substantial parts of the mounting structure.
Figure 1B:
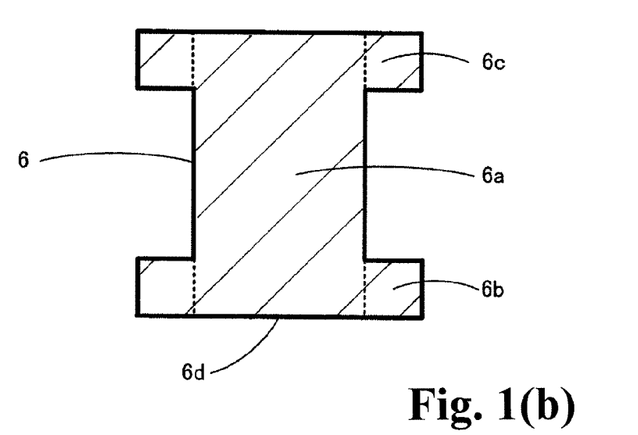
FIG. 1(b) is an enlarged view of an anchor 6.

FIG. 1 is a configuration diagram of a mounting structure for a printed circuit board according to a first embodiment of the present invention, wherein FIG. 1(a) is a cross-sectional diagram of substantial parts of the mounting structure, and FIG. 1(b) is an enlarged view of an anchor 6. A section "A" enclosed by a dashed line is the mounting structure for a printed circuit board according to the present invention. Fixation members 2 are fixed to corners of a main body 1, and a printed circuit board 5 is disposed above the main body 1 in such a manner that corners of the printed circuit board 5 are positioned on the fixation members 2. The printed circuit board 5 is fixed to the fixation members 2 by screwing the corners of the printed circuit board 5 with screws 10. The fixation members 2 and the screws 10 configure screw members 14.

A heavy material 3, such as a transformer, a reactor, a capacitor (an electrolytic capacitor, in particular), an inductor, or a connector, is fixed in the central part of a front surface of the printed circuit board 5. Light materials 4, such as resistors or semiconductor elements, are fixed around the heavy material 3. Depending on the printed circuit board, the heavy material 3 may be an electrical part of approximately 2.5 grams or more, or, more specifically, approximately 2.5 to 10 grams. The light materials 4 are electrical parts lighter than the heavy material 3.

The anchor 6 (a metal fixing member) is soldered to a rear surface of the printed circuit board 5 immediately below the heavy material 3. A tray 7 (a resin receiving member) is fixed onto the main body 1 by resin adhesive or the like. Of course, the tray 7 can be integrated with the main body 1 to create a member for configuring the main body 1. When the printed circuit board 5 is placed on the fixation members 2, the anchor 6 is inserted into the tray 7. Subsequently, the screws 10 are screwed into the fixation members 2, to fix the printed circuit board 5 to the fixation members 2. Further, the anchor 6 is fixed to the tray 7 by resin adhesive 8 made of a hard material such as epoxy resin.

Figure 2:
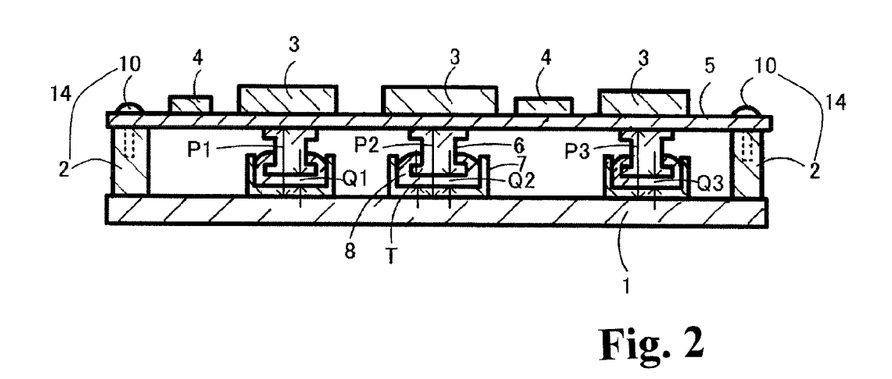
FIG. 2 is a cross-sectional view of substantial parts of the mounting structure having a plurality of heavy materials.

A gap T is formed between a bottom surface 6d of the abovementioned anchor 6 and a bottom surface 7a of the concave tray 7. This gap T is approximately 0.1 mm. Even when the sizes of the printed circuit board 5 and the main body 1 vary, the presence of the gap T allows the anchor 6 to be disposed on the tray 7 without having the bottom surface 6d contacting the bottom surface 7a of the tray 7. The anchor 6 is configured by a central pillar portion 6a, convex portions 6b disposed around a bottom portion of the pillar portion 6a, and eaves 6c disposed around an upper portion of the pillar portion 6a. When there is a plurality of heavy materials 3, the anchor 6 and the tray 7 need to be provided as many as the number of heavy materials 3, as shown in FIG. 2. Even when distances P1, P2, P3 between the printed circuit board 5 immediately below the heavy materials 3 and the main body 1 vary from one another or when distances Q1, Q2, Q3 between the plurality of anchors 6 and trays 7 vary from one another, the corresponding gaps T between the bottom surfaces 6d of the anchors 6 and the bottom surfaces 7a of the trays 7 can absorb the variations of these distances, allowing the anchors 6 to securely be disposed on the trays 7 without having the bottom surfaces 6d of the anchors 6 abutting with the bottom surfaces 7a of the trays 7.

The anchor 6 described above is produced from, for example, metal. The tray 7 is produced from, for example, resin. The anchor 6 may be fixed to the rear surface of the printed circuit board 5 by resin adhesive made of epoxy resin; however, soldering the anchor 6 to the rear surface of the printed circuit board 5 can realize stronger connection between the anchor 6 and the printed circuit board 5 and therefore is more preferable. The tray 7 may be fixed to the main body 1 by resin adhesive or soldering. When soldering the tray 7 to the main body 1, the resin surface Lo be adhered need to be coated with a metal film.

Because the heavy material 3 is fixed to the main body 1 via the printed circuit board 5, the anchor 6 and the tray 7, the amplitude of the heavy material 3 is the same as that of the main body 1. Also, because the printed circuit board 5 is fixed to the main body 1 by the section corresponding to the heavy material 3, the lateral distance between each of the screws 10 with which the printed circuit board 5 is fixed and the section corresponding to the heavy material 3 is short. Thus, a resonance frequency of the printed circuit board 5 is greater than a vibration frequency of the main body 1, preventing the printed circuit board 5 having the heavy material 3 thereon from being destroyed by its resonance.

Figure 3A:
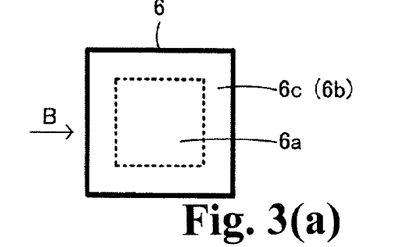
FIG. 3(a) is a plan view showing substantial parts of the anchor 6.
Figure 3B:
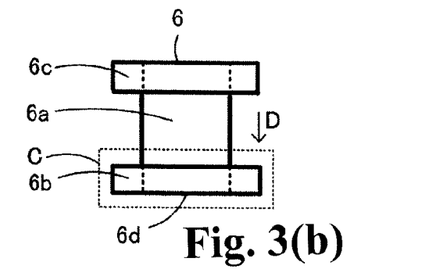
FIG. 3(b) is a side view of the substantial parts, showing FIG. 3(a) from a direction of an arrow B.
Figure 3C:
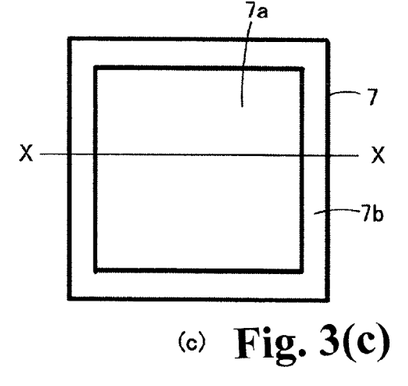
FIG. 3(c) is a plan view showing substantial parts of a tray 7.
Figure 3D:
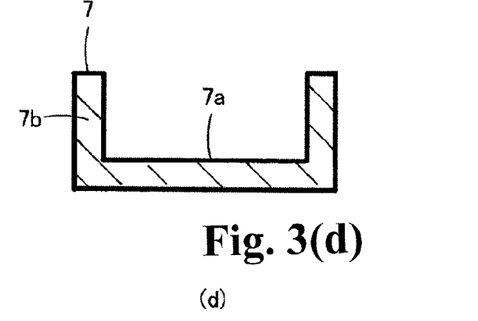
FIG. 3(d) is a cross-sectional view showing substantial parts taken along a line X-X of FIG. 3(c)
Figure 3E:
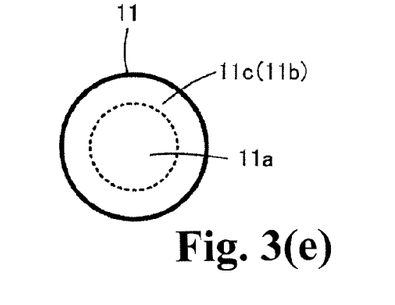
FIG. 3(e) is a plan view showing substantial parts of another anchor 11.
Figure 3F:
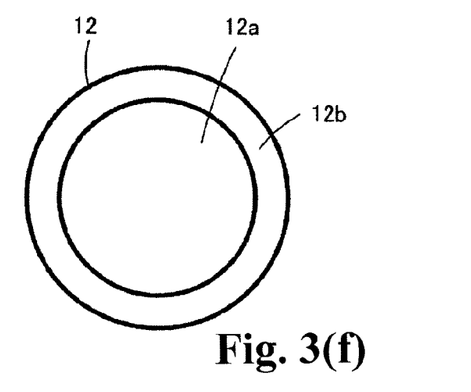
FIG. 3(f) is a plan view showing substantial parts of a tray 12 of the anchor 11 shown in FIG. 3(e)
Figure 3G:
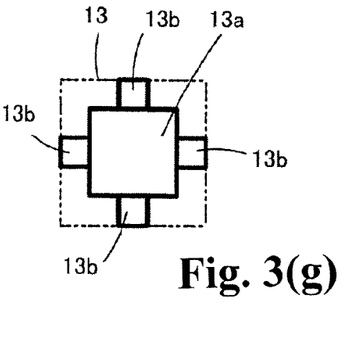
FIG. 3(g) is a plan view of substantial parts of another anchor 13 showing the same sections from the same direction as in FIG. 3(b) in which a section C of the anchor 6 is viewed from a direction of an arrow D.
Figure 3H:
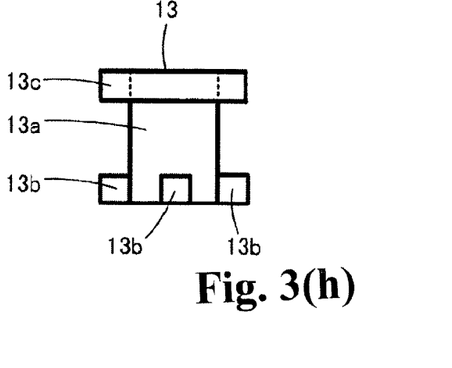
FIG. 3(h) is a side view of the substantial parts of the anchor 13 shown in FIG. 3(g).

FIGS. 3(a)-3(h) are diagrams showing a mounting member of FIG. 1(a), wherein FIG. 3(a) is a plan view showing substantial parts of the anchor 6, FIG. 3(b) is a side view of the substantial parts, showing FIG. 3(a) from a direction of an arrow B, FIG. 3(c) is a plan view showing substantial parts of the tray 7, FIG. 3(d) is a cross-sectional view of the substantial parts, taken along a line X-X of FIG. 3(c), FIG. 3(e) is a plan view showing substantial parts of another anchor 11, FIG. 3(f) is a plan view showing substantial parts of a tray 12 of the anchor 11, FIG. 3(g) is a plan view of substantial parts of another anchor 13, showing a section C of FIG. 3(b) from a direction of an arrow D, and FIG. 3(h) is a side view of the substantial parts of the anchor 13 shown in FIG. 3(g). Note that reference numerals 7a and 12a in this diagram represent the bottom surfaces of the trays 7 and 12, and reference numerals 7b and 12b represent side walls of the trays 7 and 12.

The anchors 6, 11, 13 shown in the diagram are provided with eaves 6c, 11c, 13c at the top and make wide joining areas with the printed circuit board 5 due to the presence of the eaves 6c, 11c, 13c. These eaves 6c, 11c, 13c are not always required when upper ends of pillar portions 6a, 11a, 13a of the anchors 6, 11, 13 are wide. In addition, convex portions 6b, 11b, 13b are formed horizontally in the bottom portions of the anchors 6, 11, 13. The convex portions 6b, 11b, 13b inhibit the anchors 6, 11, 13 from moving vertically. For this reason, it is important that the anchors 6, 11, 13 be provided with the convex portions 6b, 11b, 13b.

By fixing the bottom portions of the anchors 6, 11, 13 to the trays 7, 12 by the resin adhesive 8 made of epoxy resin, the anchors 6, 11, 13 cannot move back and forth or left and right. The tray for the anchor 13 is the same as the tray for the anchor 6.

For example, as illustrated in FIG. 1(a), by using the mounting member 9 configured by the anchor 6, the tray 7, and the resin adhesive 8 made of epoxy resin or the like, the printed circuit board 5 with the heavy material 3 thereon is fixed to the main body 1 with respect to X, Y, and Z directions and moves in the same manner as the main body 1 having a low vibration frequency.

Figure 4:
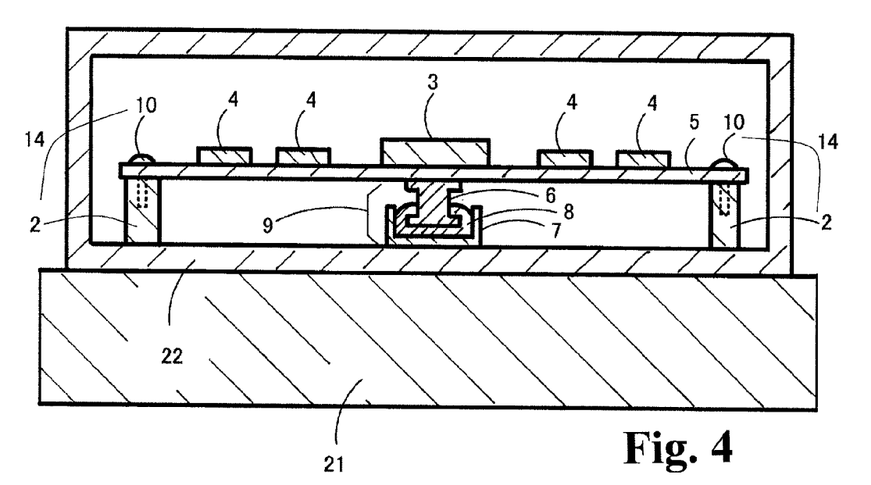
FIG. 4 is a configuration diagram showing substantial parts of an example of a mounting structure for a printed circuit board.

FIG. 4 is a configuration diagram showing substantial parts of an example of a mounting structure for a printed circuit board. This is an example in which the printed circuit board 5 with the heavy material 3 thereon is fixed inside a protective box 22 that is mounted in an automobile chassis 21 (a frame to which an engine and tires are mounted). The chassis 21 and the protective box 22 correspond to the main body described in the first embodiment. The printed circuit board 5 immediately below the heavy material 3 is fixed to the protective box 22 via the mounting member 9, and this protective box 22 is mounted in the chassis 21. Because the printed circuit board 5 immediately below the heavy material 3 is fixed to the chassis 21, the printed circuit board 5 can be prevented from being destroyed by its resonance.

<Second Embodiment>

Figure 5:
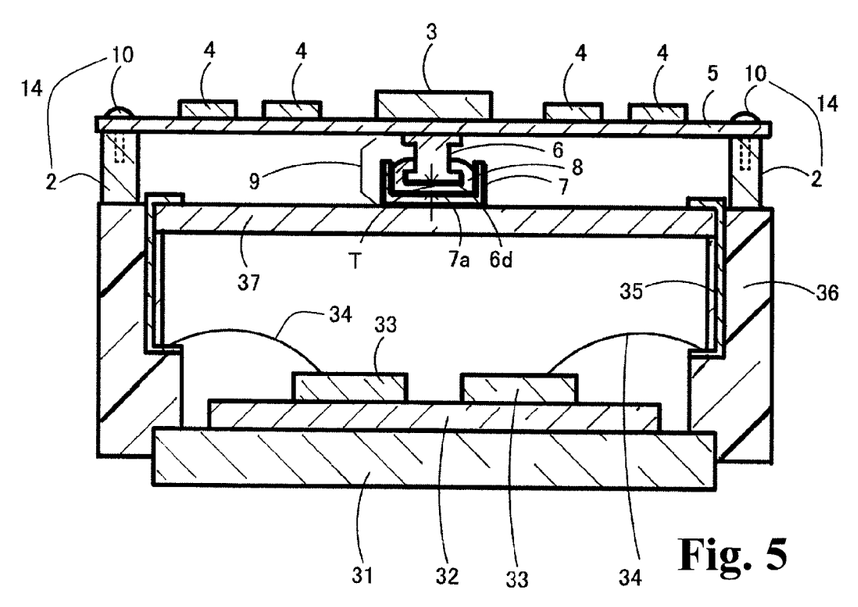
FIG. 5 is a cross-sectional view showing substantial parts of a semiconductor device according to a second embodiment of the present invention.

FIG. 5 is a cross-sectional view showing substantial parts of a semiconductor device according to a second embodiment of the present invention. This semiconductor device is an example of a power semiconductor module. This diagram is a schematic diagram.

A conductive-patterned insulating substrate 32 is joined to the top of a heat dissipation base 31 with solder, not shown. Then, semiconductor chips 33 are joined to the top of the conductive-patterned insulating substrate 32 with solder, not shown. The semiconductor chips 33 are connected to connecting conductors such as bonding wires 34. The bonding wires 34 are connected to an external lead terminal 35. A resin case 36 is fixed to the heat dissipation base 31 by adhesive, not shown. A lid 37 is fixed to the resin case 36.

The printed circuit board 5 is disposed above the lid 37. The printed circuit board 5 is screwed, using the screws 10, to the fixation members 2 fixed to the resin case 36. A drive circuit, not shown, which controls/drives/protects each semiconductor chip 33, is formed in this printed circuit board 5. This drive circuit is equipped with the heavy material 3 such as a transformer, a capacitor, or an inductor, as well as the light materials 4 such as semiconductor elements, resistors or other electrical circuit parts. The anchor 6 shown in FIG. 3(a) is fixed immediately below the printed circuit board 5 having the heavy material 3 thereon, and the tray 7 shown in FIG. 3(d) is fixed to the top of the lid 37. The anchor 6 is fitted into the tray 7, and the resin adhesive 8 made of epoxy resin or the like fills up the tray 7, to fix the anchor 6 and the tray 7 to each other by means of the resin adhesive 8 made of epoxy resin or the like.

Because the heavy material 3 is fixed to the lid 37 of the power semiconductor module via the printed circuit board 5, the anchor 6, and the tray 7, the amplitude of the heavy material 3 becomes equal to the amplitude of the lid 37. Also, because the printed circuit board 5 is fixed to the lid 37 at the position of the heavy material 3, the gap between the positions by which the printed circuit board 5 is fixed becomes narrower than in the case where the printed circuit board 5 is fixed only with the screws 10. Thus, the resonance frequency of the printed circuit board 5 becomes higher than the vibration frequency of the lid 37, preventing the printed circuit board 5 with the heavy material 3 thereon from being destroyed by its resonance.

Moreover, because the resin adhesive or solder is used to fix the heavy material 3 to the lid 37 of the power semiconductor module via the printed circuit board 5, the anchor 6, and the tray 7, the power semiconductor module can withstand high temperatures, unlike foam such as polyurethane.

<Third Embodiment>

Figure 6:
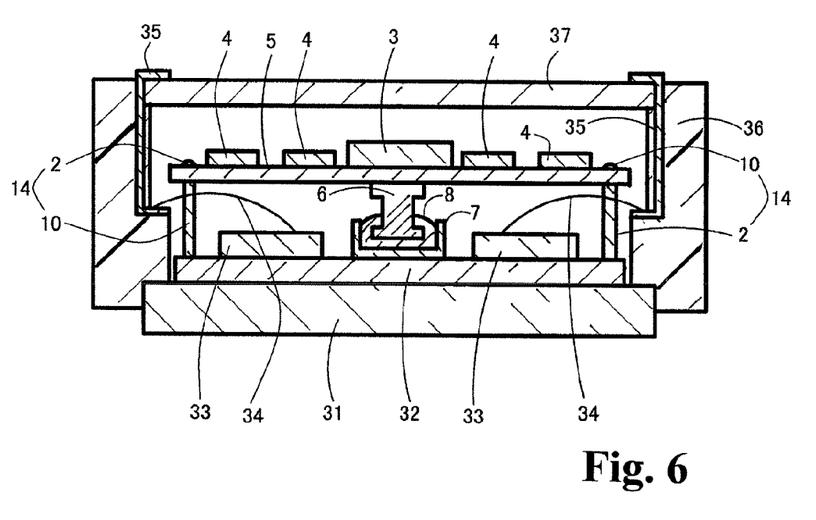
FIG. 6 is a cross-sectional view showing substantial parts of a semiconductor device according to a third embodiment of the present invention.

FIG. 6 is a cross-sectional view showing substantial parts of a semiconductor device according to a third embodiment of the present invention. This semiconductor device is an example of a power semiconductor module. This diagram is a schematic diagram.

The difference between FIG. 5 and FIG. 6 is that the printed circuit board 5 is disposed inside the resin case 36 in FIG. 6. The conductive-patterned insulating substrate 32 is joined to the top of the heat dissipation base 31 with solder, not shown. Then, the semiconductor chips 33 are joined to the top of the conductive-patterned insulating substrate 32 with solder, not shown. The semiconductor chips 33 are connected to, for example, the bonding wires 34. The bonding wires 34 are connected to the external lead terminal 35. The resin case 36 is fixed to the heat dissipation base 31 by adhesive, not shown. The printed circuit board 5 is disposed above the semiconductor chips 33. This printed circuit board 5 is screwed, using the screws 10, to the fixation members 2 fixed to the conductive-patterned insulating substrate 32. A drive circuit, not shown, which controls/drives/protects each semiconductor chip 33, is formed in this printed circuit board 5. This drive circuit is equipped with the heavy material 3, such as a capacitor or an inductor, and the light materials 4 such as semiconductor elements or resistors. In this case, the printed circuit board 5 is fixed by being screwed at four sections, and the anchor 6 is fixed to the rear surface of the printed circuit board 5 immediately below the heavy material 3. The anchor 6 is fixed to the tray 7 by the resin adhesive 8, and the tray 7 is fixed to the conductive-patterned insulating substrate 32. The structures of the anchor 6 and the tray 7 are the same as those shown in FIG. 3. In this case as well, the same effects as those described above can be achieved.

What is claimed is:

1. A mounting structure for a printed circuit board, comprising:
    a printed circuit board to which a heavy material is fixed;
    a fixing member including a bottom portion having a flat bottom surface, and fixed to the printed circuit board immediately below the heavy material;
    a main body arranged apart from the printed circuit board to form a space therebetween; and
    a receiving member including a flat upper surface, and fixed to the main body such that the flat upper surface faces the flat bottom surface in the space to form a gap therebetween,
    wherein the fixing member is fixed to the receiving member through a resin adhesive, and only the resin adhesive exists in the gap between the flat bottom surface and the flat upper surface.

2. A mounting structure for a printed circuit board according to claim 1, wherein the fixing member is a metal anchor,
    the receiving member is a resin tray, and
    the resin adhesive is an epoxy resin.

3. A mounting structure for a printed circuit board according to claim 1, wherein a side surface of the bottom portion of the fixing member has a projection.

4. A mounting structure for a printed circuit board according to claim 1, wherein the receiving member is a part of the main body.

5. A semiconductor device, comprising:
    a heat dissipation base;
    an insulating substrate with a conductive-pattern, fixed onto the heat dissipation base;
    a semiconductor chip fixed to the insulating substrate with the conductive-pattern;

an electric conductor connecting the semiconductor chip and an external lead terminal;

a resin case fixed to the heat dissipation base, and storing the insulating substrate with the conductive-pattern, fixed with the semiconductor chip;

a lid fixed to the resin case;

a receiving member fixed onto the lid;

a fixing member having a bottom portion fixed to the receiving member by a resin adhesive;

a printed circuit board to which an upper portion of the fixing member is fixed; and a screw member for fixing each of corners of the printed circuit board to the resin case, wherein the printed circuit board, the fixing member, the receiving member, and the resin adhesive configure a mounting structure for the printed circuit board.

6. A semiconductor device according to claim 5, wherein the fixing member is a metal anchor, the receiving member is a resin tray, and the resin adhesive is an epoxy resin.

7. A semiconductor device according to claim 5, wherein a projection in a horizontal direction is disposed in the bottom portion of the fixing member.

8. A semiconductor device according to claim 5, wherein the receiving member is a part of the lid.

9. A mounting structure for a printed circuit board according to claim 1, wherein the fixing member includes a pillar portion, an eave portion protruding outwardly from an upper portion of the pillar portion to widely form a joining area fixed to the printed circuit board, and a convex portion having the flat bottom surface and protruding outwardly from a bottom portion of the pillar portion; and the receiving member includes the flat upper surface and a side wall portion protruding upwardly from an edge portion of the flat upper surface to form a receiving space thereinside to receive the fixing member.

10. A mounting structure for a printed circuit board according to claim 9, wherein the pillar portion is a square column, and the eave portion and the convex portion protrude outwardly along an outer circumference of the square column, respectively, and the side wall portion extends along the edge portion of the flat upper surface such that the receiving space has a square shape.

11. A mounting structure for a printed circuit board according to claim 9, wherein the pillar portion is a cylinder, and the eave portion and the convex portion protrude circularly outwardly along an outer circumference of the cylinder, respectively, and the side wall portion extends along the edge portion of the flat upper surface such that the receiving space has a circular shape.

12. A mounting structure for a printed circuit board according to claim 9, wherein the pillar portion is a square column, the eave portion protrudes outwardly along an outer circumference of the square column, and the convex portion includes projections horizontally outwardly protruding from each side of the square column to be received in the receiving space.

13. A mounting structure for a printed circuit board according to claim 9, wherein the resin adhesive is filled in the receiving space to entirely cover the convex portion, and the fixing member is inhibited from moving in a vertical direction thereof through the convex portion and the resin adhesive.

14. A mounting structure for a printed circuit board according to claim 1, wherein the resin adhesive exists only between the fixing member and the main body to support the fixing member above the main body.

* * * * *

UNITED STATES PATENT AND TRADEMARK OFFICE
CERTIFICATE OF CORRECTION

| | | |
|---|---|---|
| PATENT NO. | : 9,165,852 B2 | Page 1 of 1 |
| APPLICATION NO. | : 14/349023 | |
| DATED | : October 20, 2015 | |
| INVENTOR(S) | : Noriho Terasawa et al. | |

It is certified that error appears in the above-identified patent and that said Letters Patent is hereby corrected as shown below:

IN THE SPECIFICATION

Please change column 2, line 42, from "... circuit board" to --... circuit board 5--.

Please change column 6, line 18, from "... surface Lo be ..." to --... surface to be ...--.

Please change column 6, line 32, from "... mounting member" to --... mounting member 9--.

Please change column 6, line 49, from "... 11c, 13cat the ..." to --... 11c, 13c at the ...--.

Signed and Sealed this
Seventeenth Day of May, 2016

Michelle K. Lee
*Director of the United States Patent and Trademark Office*